(12) United States Patent
Clatterbuck

(10) Patent No.: US 9,331,253 B2
(45) Date of Patent: May 3, 2016

(54) LIGHT EMITTING DIODE (LED) COMPONENT COMPRISING A PHOSPHOR WITH IMPROVED EXCITATION PROPERTIES

(71) Applicant: Cree, Inc., Durham, NC (US)

(72) Inventor: David M. Clatterbuck, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/476,049

(22) Filed: Sep. 3, 2014

(65) Prior Publication Data

US 2016/0064623 A1 Mar. 3, 2016

(51) Int. Cl.
*H01L 33/50* (2010.01)
*C09K 11/77* (2006.01)

(52) U.S. Cl.
CPC .......... *H01L 33/504* (2013.01); *C09K 11/7774* (2013.01); *H01L 33/505* (2013.01)

(58) Field of Classification Search
CPC ............................ H01L 33/504; H01L 33/505
See application file for complete search history.

(56) References Cited

U.S. PATENT DOCUMENTS

| | | | |
|---|---|---|---|
| 3,564,322 A | 2/1971 | Blasse et al. | |
| 4,024,070 A | 5/1977 | Schuil | |
| 4,034,257 A | 7/1977 | Hoffman | |
| 4,479,866 A | 10/1984 | Sone et al. | |
| 5,076,964 A | 12/1991 | Kasenga et al. | |
| 6,409,938 B1 | 6/2002 | Comanzo | |
| 7,267,786 B2 | 9/2007 | Fiedler et al. | |
| 8,232,564 B2 | 7/2012 | Chakraborty | |
| 8,350,465 B2 | 1/2013 | Winkler et al. | |
| 8,747,697 B2 | 6/2014 | Clatterbuck et al. | |
| 2003/0020101 A1* | 1/2003 | Bogner | C09K 11/7735 257/233 |
| 2008/0179611 A1 | 7/2008 | Chitnis et al. | |
| 2010/0032623 A1 | 2/2010 | Lange | |
| 2010/0123104 A1 | 5/2010 | Collins et al. | |
| 2010/0155763 A1 | 6/2010 | Donofrio et al. | |
| 2010/0301739 A1 | 12/2010 | Nakamura et al. | |
| 2011/0220929 A1* | 9/2011 | Collins | C09K 11/0883 257/98 |
| 2012/0305958 A1 | 12/2012 | Seibel, II et al. | |
| 2012/0306355 A1 | 12/2012 | Seibel, II | |
| 2012/0313124 A1* | 12/2012 | Clatterbuck | H01L 33/502 257/98 |
| 2013/0009541 A1* | 1/2013 | Zheng | C09K 11/0883 313/503 |
| 2013/0193836 A1 | 8/2013 | Seibel, II et al. | |
| 2014/0167600 A1* | 6/2014 | Todorov | H05B 33/12 313/503 |

FOREIGN PATENT DOCUMENTS

WO WO 2011/102566 A1 8/2011
WO WO 2012/170266 A1 12/2012

OTHER PUBLICATIONS

International Search Report Application and Written Opinion for International Application No. PCT/US2013/074287, mailing date Jan. 27, 2014.
Fadlalla, H. M. H. et al., "Synthesis and characterization of photoluminescent cerium-doped yttrium aluminum garnet," *Materials Research Bulletin*, 43, 12 (2008) pp. 3457-3462.
Maniquiz, M.C. et al., "Luminescence Comparison and Enhancement of Ce-doped Yttrium Aluminum Garnet Phosphor via Cation Substitution and Adding Flux," *Journal of the Electrochemical Society*, 158, 7 (2011), Abstract Only.
Pan, Yuexiao et al., "Tailored photoluminescence of YAG:Ce phosphor through various methods," *Journal of Physics and Chemistry of Solids*, 65, 5 (2004) pp. 845-850.
* cited by examiner

*Primary Examiner* — Mamadou Diallo
(74) *Attorney, Agent, or Firm* — Brinks Gilson & Lione

(57) ABSTRACT

A light emitting diode (LED) component comprises an LED having a dominant wavelength in a range of from about 425 nm to about 475 nm, and a first phosphor and a second phosphor are in optical communication with the LED. The first phosphor has a peak emission wavelength in the range of from about 600 nm to about 700 nm, and the second phosphor has a peak emission wavelength in the range of from about 500 nm to about 600 nm. An excitation spectrum of the first phosphor includes, at excitation wavelengths longer than 530 nm, no intensities greater than about 60% of a maximum intensity of the excitation spectrum.

25 Claims, 3 Drawing Sheets

LIGHT EMITTING DIODE (LED) COMPONENT COMPRISING A PHOSPHOR WITH IMPROVED EXCITATION PROPERTIES

TECHNICAL FIELD

The present disclosure is related generally to phosphors for light emitting devices and more particularly to a light emitting diode component comprising a phosphor with improved excitation properties.

BACKGROUND

Light emitting diodes (LEDs) are solid state devices that convert electric energy to light, and generally comprise one or more active layers of semiconductor material sandwiched between oppositely doped layers so as to define a p-n junction. When a bias is applied across the p-n junction, holes and electrons are injected into the active layer where they recombine to generate light in a process called injection electroluminescence. Light may be emitted from the active layer through all surfaces of the LED.

As most LEDs are nearly monochromatic light sources that appear to emit light having a single color, light emitting devices or lamps including multiple LEDs that can emit light of different colors have been employed to produce white light. In these devices, the different colors of light emitted by the individual LEDs combine to produce a desired intensity and/or color of white light. For example, by simultaneously energizing red, green and blue light emitting LEDs, the resulting combined light may appear white, or nearly white.

As an alternative to combining individual LEDs to produce light emitting devices having a particular light emission spectrum, luminescent materials, or phosphors, may be used to control the color of light emitted from LEDs. A phosphor may absorb a portion of the light emitted from an LED at a given wavelength and re-emit the light at different wavelength via the principle of photoluminescence. The conversion of light having a shorter wavelength (or higher frequency) to light having a longer wavelength (or lower frequency) may be referred to as down conversion. For example, a down-converting phosphor may be combined with a blue LED to convert some of the blue wavelengths to yellow wavelengths in order to generate white light.

A widely used phosphor for white light generation is yttrium aluminum garnet (YAG), which may be doped with cerium (Ce), e.g., $Y_{3-x}Ce_xAl_5O_{12}$ or YAG:Ce. This yellow phosphor may be used in combination with a blue LED to produce white light. Compared to other phosphors based on silicates and sulfides, for example, YAG:Ce has a relatively high absorption efficiency of blue excitation radiation, a high quantum efficiency (greater than 90%), good stability in high temperature and/or high humidity environments, and a broad emission spectrum.

In some cases, a red phosphor is added to an LED component including a blue LED and a yellow or green phosphor in order to further shift the emitted light into the desired neutral white color bins on the 1931 CIE chromaticity diagram. The red phosphors most commonly used in LED components have excitation spectra that extend from less than 400 nm to about 600 nm, as shown in FIG. 1. The blue LEDs used in these components may emit blue light over a wavelength range of from 425 nm to 475 nm, or more typically from 430 nm to 470 nm, and yellow/green phosphors also present in the components may emit light over a wavelength range of 500 nm to 600 nm. Thus, a red phosphor may be excited by light from the blue LED (as intended), and also from the yellow/green phosphor. Because the light conversion efficiencies of phosphors are not 100%, light emitted from a blue LED that is down-converted by a yellow/green phosphor before reaching the red phosphor is converted less efficiently than light that reaches the red phosphor directly from the blue LED.

BRIEF SUMMARY

A light emitting diode (LED) component comprises an LED having a dominant wavelength in a range of from about 425 nm to about 475 nm, and a first phosphor and a second phosphor are in optical communication with the LED. The first phosphor has a peak emission wavelength in the range of from about 600 nm to about 700 nm, and the second phosphor has a peak emission wavelength in the range of from about 500 nm to about 600 nm. An excitation spectrum of the first phosphor comprises, at excitation wavelengths longer than 530 nm, no intensities greater than about 60% of a maximum intensity of the excitation spectrum.

A phosphor with improved excitation properties comprises a host lattice and an activator comprising a rare earth or transition metal element in the host lattice. The phosphor comprises a peak emission wavelength in the range of from about 600 nm to about 700 nm, and an excitation spectrum of the phosphor comprises, at excitation wavelengths longer than 530 nm, no intensities greater than about 60% of a maximum intensity of the excitation spectrum.

DETAILED DESCRIPTION

Definitions and Terminology

Figure 1:
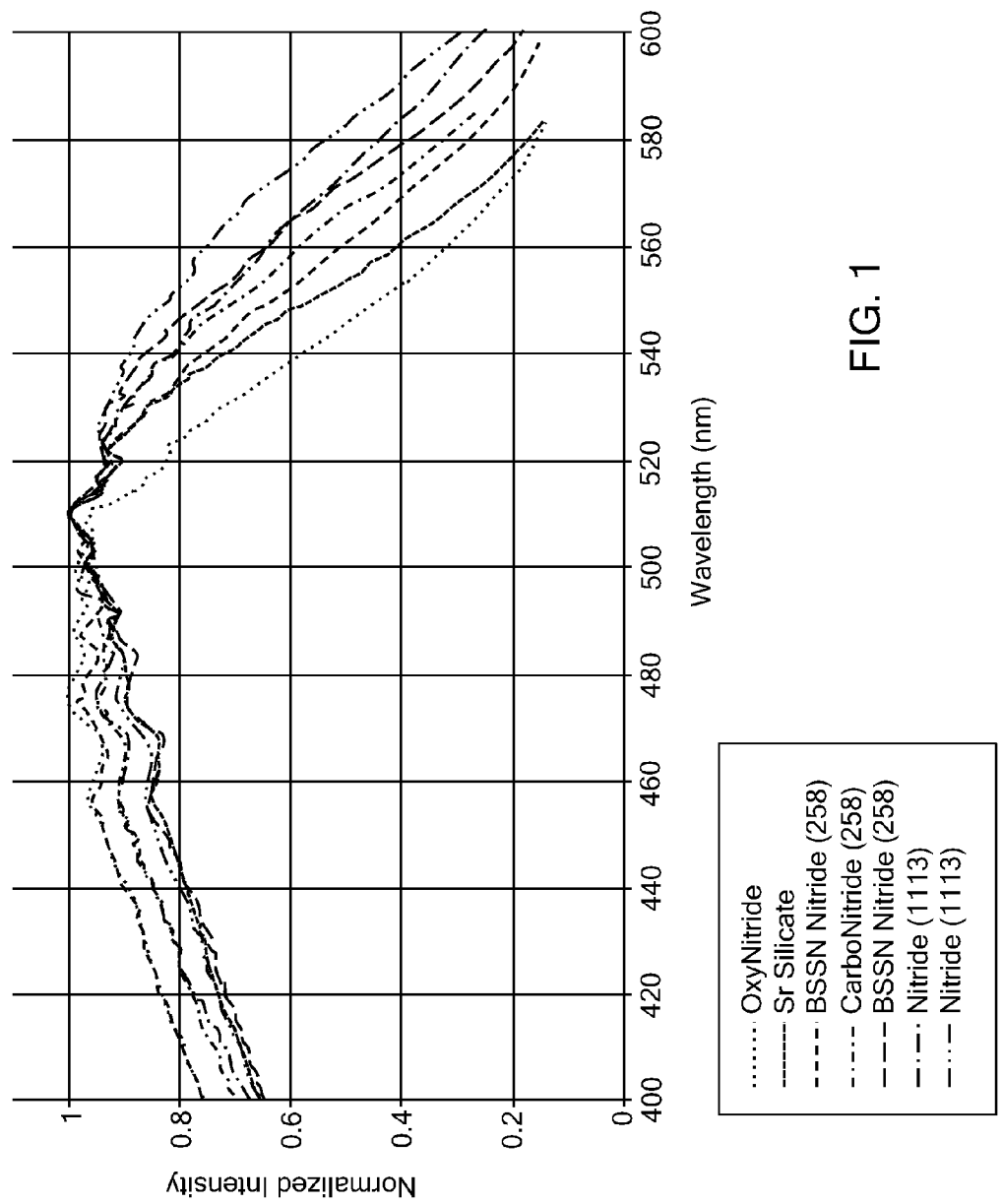
FIG. 1 shows normalized photoluminescence (PL) excitation spectra for several commercially available red phosphors.

As used in the present disclosure, a "phosphor" or "phosphor composition" may refer to a material that absorbs light at one wavelength and re-emits the light at a different wavelength, where the re-emission includes visible light. The term phosphor may be used herein to refer to materials that are sometimes referred to as fluorescent and/or phosphorescent materials.

Also as used herein, "host lattice" refers to a crystal lattice of a given material that further includes a dopant, or "activator."

"Peak emission wavelength" refers to the wavelength of light at which the emission intensity of a phosphor or an LED is a maximum. LEDs typically have a light emission spectrum or intensity distribution that is tightly centered about the peak emission wavelength. The light emission spectrum of a phosphor or an LED may be further characterized in terms of the width of the intensity distribution measured at half the maximum light intensity (referred to as the full width at half maximum or "FWHM" width).

"Dominant wavelength" refers to the wavelength of light that has the same apparent color as the light emitted from the phosphor or LED as perceived by the human eye. Thus, the dominant wavelength differs from the peak wavelength in that the dominant wavelength takes into account the sensitivity of the human eye to different wavelengths of light.

A first device or phosphor that is described as being "in optical communication with" a second device or phosphor is positioned such that light emitted from the first device reaches the second device.

As used herein, "ccx" or "CCx" refers to correlated color X and "ccy" or "CCy" refers to correlated color y, where these coordinates (ccx, ccy) are calculated using the standard color matching functions that describe the 1931 CIE color space or chromaticity diagram.

A "reducing environment" is an environment controlled to include substantially no oxygen and/or oxidizing gases. The reducing environment may further contain actively reducing gases.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, of manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Description of Embodiments

Described herein is a red phosphor engineered to absorb strongly in the emission wavelength range of blue LEDs but much less so in the emission wavelength range of yellow or green phosphors. LED components formed using such a red phosphor in addition to a yellow and/or green phosphor may exhibit a higher light conversion efficiency than conventional LED components.

Figure 2:
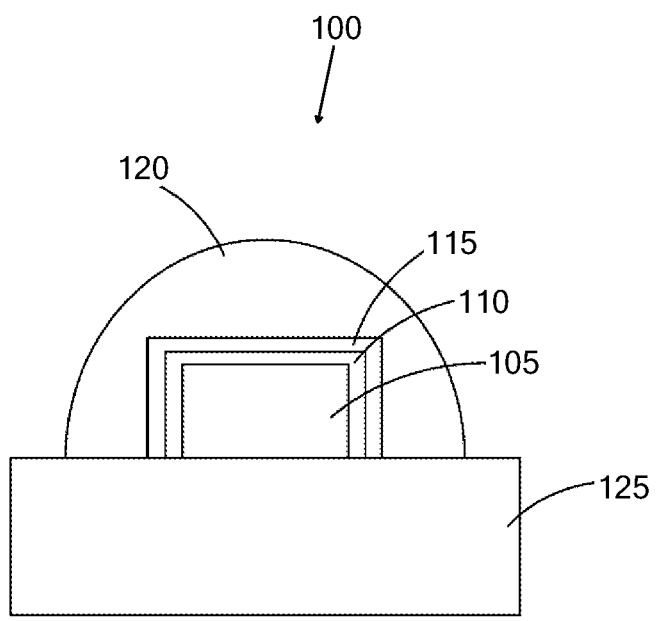
FIG. 2 shows a schematic of an exemplary LED component including a blue LED, an exemplary red phosphor as described herein, and a yellow phosphor.

Referring to FIG. 2, an exemplary LED component 100 comprises a blue LED 105 having a dominant wavelength in a range of from about 425 nm to about 475 nm, and a red phosphor 110 and a yellow or green phosphor 115 are in optical communication with the blue LED. The red phosphor 110 comprises a peak emission wavelength in the range of from about 600 nm to about 700 nm and the yellow or green phosphor 115 comprises a peak emission wavelength in the range of from about 500 nm to about 600 nm. In some cases, the peak emission wavelength of the red phosphor 110 may fall in the range of from about 600 nm to about 650 nm, or from about 620 nm to about 650 nm. In the exemplary LED component 100 of FIG. 2, the red phosphor 110 and the yellow or green phosphor 115 are shown in separate phosphor layers; alternatively, the red phosphor 110 and the yellow or green phosphor 115 may be mixed together in a single phosphor layer.

The red phosphor 110 comprises a host lattice including a rare earth or transition metal element as an activator. The red phosphor may be based on a yttrium aluminum garnet lattice doped with Ce (YAG:Ce). Typically, YAG:Ce is a green or yellow emitting phosphor. In the present disclosure, additional dopants—in particular silicon (Si) and magnesium (Mg)—are employed to provide the desired shift of the phosphor emission to red emission wavelengths. Also achieved is an excitation spectra that is shifted to shorter wavelengths compared to other commercially available red phosphors. The excitation spectrum of the red phosphor 110 comprises, at excitation wavelengths greater than 530 nm, no intensities greater than about 60% of a maximum intensity of the excitation spectrum; in some cases, there are no intensities greater than about 50% of the maximum intensity of the excitation spectrum at wavelengths greater than 530 nm. Accordingly, the amount of yellow or green light absorbed by the red phosphor during operation of the LED component may be minimized.

To achieve the desired excitation and emission characteristics, the red phosphor may comprise a host lattice comprising YAG, an activator comprising Ce incorporated in the host lattice, a first substitutional dopant comprising Si incorporated in the host lattice, and a second substitutional dopant comprising Mg incorporated in the host lattice. In the host lattice, Mg and Si each substitute for Al.

A mole percentage of Ce (mol. % Ce) in the host lattice may be defined as 100·(moles of Ce)/(moles of Y+moles of Ce). Generally speaking, 0<mol. % Ce<15. A mole percentage of Mg (mol. % Mg) in the host lattice may be defined as 100·(moles of Mg)/(moles of Al+moles of Mg+moles of Si), and 0<mol. % Mg<50. Similarly, a mole percentage of Si (mol. % Si) in the host lattice may be defined as 100·(moles of Si)/(moles of Al+moles of Mg+moles of Si), and 0<mol. % Si<50.

The red phosphor may comprise a chemical formula $Y_aCe_bAl_cSi_dMg_dO_z$, where $0<a<3$, $0<b\leq0.6$, $0<c<5$, and $0<d<5$, and z is nominally 12. A value of R may be defined as $R=(a+b)/(c+2d)$. Tables 1, 2 and 3 show composition data, synthesis details and emission/excitation results from nine exemplary samples of the red phosphor.

Referring to Table 1, the exemplary red phosphor samples contain from about 3.3 mol. % to about 7.1 mol. % Ce, and from about 36.7 mol. % Mg (or mol. % Si) to about 40.0 mol .% Mg (or mol. % Si). Each of the phosphor samples has an R value ranging from 0.52 to 0.6. An R value of less than 0.6 is indicative of a non-stoichiometric YAG composition, where $a+b\neq3$ and/or $c+2d\neq5$.

TABLE 1

Composition Data

| ID | a | b | c | d | d | a + b | c + 2d | R | mol. % Ce | mol. % Mg | mol. % Si |
|---|---|---|---|---|---|---|---|---|---|---|---|
| 1 | 2.90 | 0.10 | 1.00 | 2.00 | 2.00 | 3.00 | 5.00 | 0.6 | 3.33 | 40.0 | 40.0 |
| 2 | 2.90 | 0.10 | 1.33 | 1.84 | 1.84 | 3.00 | 5.00 | 0.6 | 3.33 | 36.7 | 36.7 |
| 3 | 2.89 | 0.11 | 1.07 | 2.14 | 2.14 | 3.00 | 5.36 | 0.56 | 3.57 | 40.0 | 40.0 |
| 4 | 2.88 | 0.12 | 1.15 | 2.31 | 2.31 | 3.00 | 5.77 | 0.52 | 3.85 | 40.0 | 40.0 |
| 5 | 2.79 | 0.21 | 1.07 | 2.14 | 2.14 | 3.00 | 5.36 | 0.56 | 7.14 | 40.0 | 40.0 |
| 6 | 2.79 | 0.21 | 1.07 | 2.14 | 2.14 | 3.00 | 5.36 | 0.56 | 7.14 | 40.0 | 40.0 |
| 7 | 2.79 | 0.21 | 1.07 | 2.14 | 2.14 | 3.00 | 5.36 | 0.56 | 7.14 | 40.0 | 40.0 |
| 8 | 2.79 | 0.21 | 1.07 | 2.14 | 2.14 | 3.00 | 5.36 | 0.56 | 7.14 | 40.0 | 40.0 |
| 9 | 2.79 | 0.21 | 1.07 | 2.14 | 2.14 | 3.00 | 5.36 | 0.56 | 7.14 | 40.0 | 40.0 |

TABLE 2

Synthesis Details

| ID | AlF$_3$ (wt. %) | BaF$_2$ (wt. %) | Temp (° C.) | Time (h) |
|---|---|---|---|---|
| 1 | — | 10 | 1550 | 2 |
| 2 | 4.5 | — | 1550 | 2 |
| 3 | — | 10 | 1500 | 2 |
| 4 | — | 10 | 1500 | 2 |
| 5 | — | 10 | 1500 | 2 |
| 6 | — | 10 | 1500 | 2 |
| 7 | — | 10 | 1400 | 2 |
| 8 | — | 10 | 1400 | 2 |
| 9 | — | 10 | 1500 | 2 |

TABLE 3

Emission and Excitation Results

| ID | PL peak emission wavelength | (Excitation intensity at 530 nm)/(maximum excitation intensity) | Wavelength where excitation intensity falls to 50% of maximum excitation intensity |
|---|---|---|---|
| 1 | 614 | 0.68 | 541 |
| 2 | 599 | 0.46 | 528 |
| 3 | 613 | 0.57 | 534 |
| 4 | 609 | 0.52 | 532 |
| 5 | 611 | 0.65 | 539 |
| 6 | 612 | 0.63 | 538 |
| 7 | 605 | 0.47 | 528 |
| 8 | 609 | 0.63 | 538 |
| 9 | 613 | 0.56 | 534 |

The red phosphor samples are synthesized through the direct reaction of the precursor oxides $Y_2O_3$, $CeO_2$, $Al_2O_3$, $SiO_2$ and MgO. A flux such as $BaF_2$ or $AlF_3$ is added to the reaction mixture. Referring to Table 2, the total amount of flux employed in preparing the exemplary phosphor samples ranges from 4.5 wt. % to 10 wt. %. The reactants were weighed out to yield $Y_aCe_bAl_cSi_dMg_dO_z$, with the chemical composition, mol. % Ce, mol. % Si, mol. % Mg, and R value for each exemplary phosphor sample as provided in Table 1. The reactants were well mixed prior to firing. Each mixture was placed in a crucible and heated to a temperature in the range of from about 1400° C. to about 1550° C. for 2 hours in a slightly reducing atmosphere. After firing, each phosphor sample was crushed, milled and sieved using standard methods.

After fabrication of the red phosphor samples, photoluminescence (PL) measurements were made using a Hitachi F-7000 Fluorescence Spectrophotometer. Emission spectra were collected using a 450 nm excitation source, and the peak emission wavelength was measured and recorded. Excitation spectra were measured by varying the excitation wavelength while monitoring the emission intensity at the pre-determined peak emission wavelength. Based on these spectra, the excitation intensity at 530 nm as compared to the maximum excitation intensity and the wavelength at which the excitation intensity falls to 50% of the maximum excitation intensity were determined and are reported in Table 3.

Figure 3:
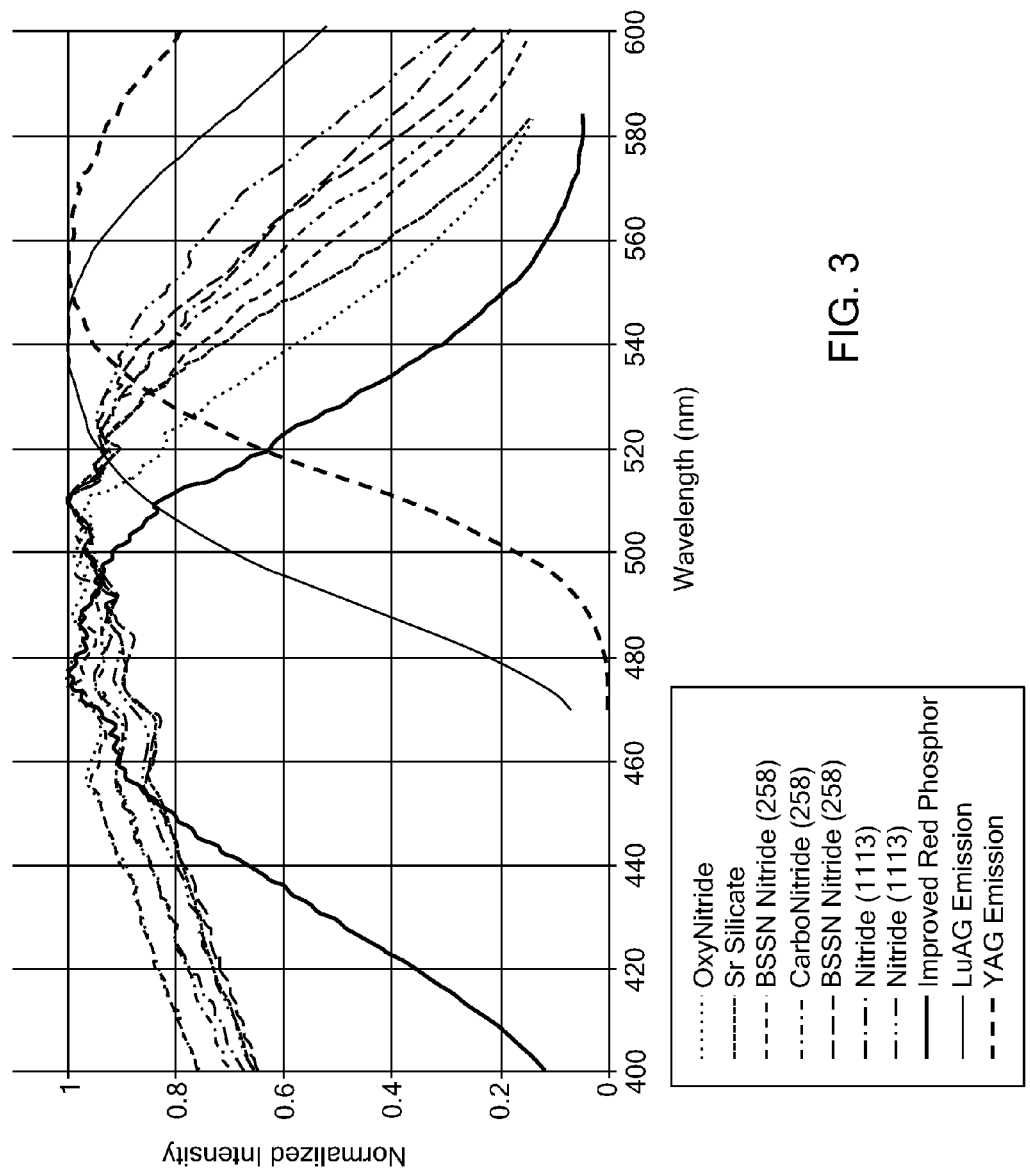
FIG. 3 shows normalized PL excitation spectra for an exemplary red phosphor having a chemical formula $Y_aCe_bAl_cSi_dMg_dO_z$ compared to the excitation spectra of a number of commercial red phosphors and to the emission spectrum of a commercial YAG phosphor.

In addition, the normalized PL excitation spectrum of red phosphor Sample 7 is plotted in FIG. 3 with PL excitation spectra for seven commercially available Eu-doped red phosphor samples, including an oxynitride $(Ca(Si,Al)_{12}(O,N)_{16})$, a silicate $(Sr_3SiO_5)$, $MAlSiN_3$ (also known as 1113 nitride) $M_2Si_5N_8$ (also known as 258 nitride), where M is Ba, Sr, and/or Ca. Also shown in the figure is the emission spectra of commercially available LuAG and YAG phosphors. The data in FIG. 3 show that excitation of the exemplary red phosphor sample occurs at shorter wavelengths than any of the commercially available red phosphors. In particular, at wavelengths greater than 530 nm, the excitation spectrum of the exemplary red phosphor consists of intensities no greater than about 50% of a maximum intensity of the excitation spectrum. In other words, the excitation spectrum of the exemplary red phosphor includes no intensities greater than about 50% of a maximum intensity of the excitation spectrum. Accordingly, the red phosphor is less strongly excited by yellow or green wavelengths and may exhibit a higher conversion efficiency when used with a blue LED than commercially available red phosphors.

As indicated above, the red phosphor may comprise a chemical formula $Y_aCe_bAl_cSi_dMg_dO_z$, where $0<a<3$, $0<b\leq0.6$, $0<c<5$, $0<d<5$, and z is nominally 12. In contrast to typical commercial red phosphors, which are Eu-activated, the red phosphor described herein is activated by Ce. In some examples, $0.1\leq b<0.3$, where typically $a+b\leq3$. Using the chemical formula, the mol. % Ce may be defined as b/(a+b)·100=mol. % Ce. Typically, 0<mol. % Ce<15, and in some examples 3 mol. % Ce≤15, or 3≤mol. % Ce≤8.

The mol. % Si and mol. % Mg may be defined as d/(c+2d)·100=mol. % Si=mol. % Mg, where 0<mol. % Si<50 and 0<mol. % Mg<50. In some cases, 30<mol. % Si<50 and 30<mol. % Mg<50. As explained above, Si and Mg substitute for Al in the host lattice and promote a red shift in the color of the YAG phosphor. The Al may be present in an amount represented by 0.5≤c≤2, or 1.0≤c≤1.5, and the Si and Mg may be present in an amount represented by 1.0≤d≤3.0, 1.5≤d≤2.5, or 2.0≤d≤2.5.

The value of R, where R is defined as (a+b)/(c+2d), may be in the range of 0.5<R≤0.6, where off-stoichiometric compositions with 0.5<R<0.6 may be advantageous. In some examples, a+b=3 and c+2d>5, or c+2d>5.5.

Returning now to FIG. 2, which shows a schematic of an LED component 100 comprising a blue LED 105 having a dominant wavelength in a range of from about 425 nm to about 475 nm along with a red phosphor 110 and a yellow or green phosphor 115 in optical communication with the blue LED. The red phosphor may have any of the characteristics described in the present disclosure. The yellow or green phosphor 115, which comprises a peak emission wavelength in the range of from about 500 nm to about 600 nm, may comprise a host lattice comprising yttrium aluminum garnet with an activator comprising Ce incorporated in the host lattice. In some embodiments, the host lattice of the yellow or green phosphor may further include Ga as a substitutional dopant.

Any of a number of commercially available Ce-doped YAG phosphors may be used as the yellow or green phosphor in the LED component. It may be advantageous to use a yellow phosphor comprising a chemical formula $Y_aCe_bGd_cAl_d\text{-}Ga_eO_z$, where 0<a<3, 0<b≤0.6, 0<c≤1, 0<d<5, 0<e≤2.5, z is nominally 12, and where R is defined as (a+b+c)/(d+e). Such a yellow phosphor is described in U.S. patent application Ser. No. 14/453,878, entitled "Light Emitting Diode (LED) Component Comprising a Phosphor with Improved Excitation Properties," which was filed on Aug. 7, 2014, and is hereby incorporated by reference in its entirety. The yellow phosphor described in U.S. patent application Ser. No. 14/453,878 has a Ce content and a Ga content engineered to provide an emission spectrum comprising a maximum intensity in a wavelength range of from about 540 nm to about 570 nm and an excitation spectrum comprising an intensity at 440 nm equivalent to at least about 85% of a maximum intensity of the excitation spectrum. Such a yellow phosphor may be efficiently excited by short wavelength blue LEDs having a dominant wavelength in a range of from about 425 nm to less than 460 nm.

Referring to the chemical formula set forth above, the yellow phosphor used in the LED component may have a Ce content determined by a value of b of at least about 0.1, at least about 0.2, or at least about 0.3. In some examples, b may be about 0.6 or less, or about 0.5 or less. For example, preferred ranges for b may include 0.1≤b≤0.6, or 0.2≤b≤0.5. In some embodiments, c=0. In addition, the Ga content may be determined by a value of e of at least about 0.3, at least about 0.6, or at least about 0.9. In some cases, e may be about 2.5 or less, or about 2 or less, about 1.5 or less, or about 1.1 or less. For example, suitable ranges for e may include one or more of the following: 0.3≤e≤2.5, 0.5≤e≤2, 0.6≤e≤1.5. Typically, 0.5≤R≤0.6, or 0.5≤R<0.6, for the yellow phosphor. To achieve this, a+b≤3 and d+e≥5. For example, d+e>5, or d+e≥5.2. In some embodiments, a+b=3.

The mol. % Ce of the yellow phosphor may be calculated as c/(a+b+c)·100, where 0<mol. % Ce<20. Preferably, 3 mol. % Ce≤20, or 3.3≤mol. % Ce≤15. The mol. % Ga of the yellow phosphor may be calculated as e/(d+e)·100, where, as indicated above, 0<mol. % Ga<50, and where Ga may alternatively be substituted with In. Preferably, 5≤mol. % Ga≤50, 12≤mol. % Ga≤50, 5≤mol. % Ga≤20, or 12≤mol. % Ga≤20. Typically, the desired emission and excitation spectra of the yellow phosphor are achieved when the ratio of the mol .% Ga to the mol. % Ce is at least 1:1 (i.e., mol. % Ga≥mol. % Ce). For example, mol. % Ga≥1.3·mol. % Ce, mol. % Ga≥1.7·mol. % Ce, mol. % Ga≥2·mol. % Ce, mol. % Ga≥3·mol. % Ce, or mol. % Ga≥4·mol. % Ce.

The LED component 100 may further include other phosphors in addition to the red phosphor 110 and the green or yellow phosphor 115. The phosphors may be mixed together or positioned separately, such as in discrete layers with a single type of phosphor in each layer. The phosphors may be coated directly on one or more surfaces of the blue LED 105, as illustrated for example in FIG. 2. The phosphors may also or alternatively be positioned remotely, such as on or within a lens or optic 115 of the LED component 100. Phosphor layer(s) applied directly to the blue LED 105 may be disposed on any or all surfaces of the LED, including the sidewalls and/or top surface, and the layer(s) may also extend onto the submount 125. In one example, a first phosphor layer applied to the blue LED 105 or overlying lens 120 may include the red phosphor 110, a second phosphor layer above or below the first layer may include the yellow or green phosphor 115, etc. In some embodiments, the phosphors may be processed to form a pellet or disc and positioned in a remote location with respect to the blue LED. The phosphors may be mixed with a binder (e.g., a silicone encapsulant) prior to use. Deposition of the phosphors may entail spray coating or another suitable method, such as one of the deposition techniques described in the following patent publications: U.S. Pat. No. 8,232,564 entitled "Wafer Level Phosphor Coating Method and Devices Fabricated Utilizing Method," U.S. Patent Application Publication No. 2010/0155763 entitled "Systems and Methods for Application of Optical Materials to Optical Elements," and U.S. Patent Application Publication No. 2008/0179611 entitled "Wafer Level Phosphor Coating Method and Devices Fabricated Utilizing Method," which are hereby incorporated by reference in their entirety.

The blue LED shown schematically in FIG. 2 may be a Group III nitride-based LED formed from nitrogen and Group III elements such as aluminum, gallium and/or indium in the form of nitride layers epitaxially grown and doped as known in the art to produce a blue LED that may preferentially emit blue light at wavelengths from 425 nm to 475 nm. In some cases, the blue LED may preferentially emit shorter wavelength blue light, e.g., at wavelengths from about 425 nm to less than 460 nm. The blue LED may be disposed on a submount 125 as shown in FIG. 2. LED components containing the blue LED may be fabricated using methods known in the art.

A method of making the red phosphor used in the LED component may entail combining one or more Ce-containing precursors with a Y-containing precursor, an Al-containing precursor, a Si-containing precursors, and a Mg-containing precursor. The mixture of precursors undergoes a reaction in a reducing environment to yield the red phosphor. Similarly, a method of making the yellow or green phosphor used in the LED component may entail combining one or more Ce-containing precursors with a Y-containing precursor, an Al-containing precursor, a Ga-containing precursor, and optionally a Gd-containing precursor. The mixture of precursors undergoes a reaction in a reducing environment to yield the yellow or green phosphor.

The one or more Ce-containing precursors used to prepare the red and/or yellow/green phosphor may include a first precursor comprising cerium and oxygen and a second precursor comprising cerium and fluorine. For example, the first precursor may comprise $CeO_2$ and the second precursor may comprise $CeF_3$. In other cases, only one Ce-containing precursor may be employed, such as $CeO_2$, which is also a source of oxygen. Other cerium and oxygen precursors that may suitable for the reaction include, for example, cerium nitrate, cerium carbonate, and/or cerium sulfate.

As set forth in U.S. Patent Application Publication 2014/0167600, when $CeF_3$ is used in combination with $CeO_2$ in the reaction mixture, a phosphor with a longer wavelength emission may be achieved (e.g, more yellow). It is believed that the enhanced yellow color may be enabled by an increase in the Ce content of the YAG host lattice, which in turn is facilitated by the combination of $CeF_3$ with $CeO_2$ during the reaction.

The Y-containing precursor in the reaction mixture is typically $Y_2O_3$ powder. The Al-containing precursor is typically $Al_2O_3$ (alumina) powder, in particular $\gamma$-$Al_2O_3$ (or $\gamma$-phase $Al_2O_3$) powder. The Mg-containing precursor and the Si-containing precursor used to form the red phosphor may be selected from among $SiO_2$ and $MgO$, for example. The Ga-containing precursor used to prepare the yellow or green phosphor may be $Ga_2O_3$, and the optional Gd-containing precursor may be $Gd_2O_3$, for example. The preceding precursor powders may be obtained from Alpha Aesar Inc. (Ward Hill, Mass.) or other commercial sources of oxide powders.

The precursor powders may have a median (d50) particle size in the range of from about 1 micron to about 200 microns, from 1 micron to about 25 microns, from about 4 microns to about 14 microns, or from about 5 microns to about 10 microns. Any of the precursor powders may be mechanically milled or otherwise processed (e.g., by jet milling) in order to reduce the average particle size of the powder before adding the precursor to the reaction mixture. The precursor powders may be milled using a commercially available jet milling apparatus, which utilizes high pressure air to break up larger particles into smaller particles.

One or more fluorine containing compounds, such as $BaF_2$, $CeF_3$, and/or $AlF_3$, may be employed as a flux during the reaction to reduce the reaction temperature and facilitate formation of the red or yellow/green phosphor. Generally, the flux may be present in the reaction mixture at a concentration of up to about 10 wt. %. For example, the concentration of the flux may be at least about 4 wt. %, at least about 6 wt. %, or at least about 8 wt. %.

The reducing environment in which the reaction mixture is heated may include a forming gas. Nitrogen gas ($N_2$) and optionally hydrogen gas ($H_2$) may be present in the forming gas. For example, the forming gas may be a mixture of nitrogen gas and hydrogen gas including up to about 10% $H_2$, or up to about 5% $H_2$. Typically, a mixture of about 95% $N_2$ and about 5% $H_2$ is suitable to obtain the desired phosphor powder. In some examples, the forming gas may be entirely hydrogen (e.g., up to 100% $H_2$). The reaction may be carried out in a chamber comprising an outer vessel and lid and containing a crucible for holding the precursors. The crucible may be made of one or more refractory materials, such as a ceramic or a refractory metal. For example, the crucible may comprise $Al_2O_3$. During the reaction, the forming gas may be flowed continuously through the chamber.

The reaction typically occurs at a temperature of at least about 1400° C. For example, the precursors may be heated to a temperature in the range of from about 1400° C. to about 1700° C., or in the range of from about 1450° C. to about 1650° C. A heating rate of from about 50° C./h to about 500° C./h, 300° C./h to about 400° C./h, or about 350° C./h may be used to heat the precursors to the reaction temperature. The dwell time at the reaction temperature is generally about 12 hours or less, and typically at least about 0.1 hour. For example, the dwell time may be from about 0.1 hour to about 12 hours, from about 0.1 hour to about 6 hours, or from about 1 hour to about 5 hours.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A light emitting diode (LED) component comprising:
   an LED comprising a dominant wavelength in a range of from about 425 nm to about 475 nm;
   a first phosphor in optical communication with the LED, the first phosphor comprising:
   a host lattice comprising yttrium aluminum garnet;
   an activator comprising Ce incorporated in the host lattice;
   a first substitutional dopant comprising Si incorporated in the host lattice; and
   a second substitutional dopant comprising Mg incorporated in the host lattice, a peak emission wavelength of the first phosphor being in the range of from about 600 nm to about 700 nm; and
   a second phosphor in optical communication with the LED, the second phosphor comprising a peak emission wavelength in the range of from about 500 nm to about 600 nm,
   wherein an excitation spectrum of the first phosphor comprises, at excitation wavelengths longer than 530 nm, no intensities greater than about 60% of a maximum intensity of the excitation spectrum.

2. The LED component of claim 1, wherein the excitation spectrum comprises no intensities greater than about 55% of the maximum intensity of the excitation spectrum at excitation wavelengths longer than 530 nm.

3. The LED component of claim 2, wherein the excitation spectrum comprises no intensities greater than about 50% of the maximum intensity of the excitation spectrum at excitation wavelengths longer than 530 nm.

4. The LED component of claim 1, wherein the peak emission wavelength of the first phosphor is in the range of from about 600 nm to about 650 nm.

5. The LED component of claim 1, wherein the first phosphor comprises a chemical formula $Y_aCe_bAl_cSi_dMg_dO_z$, where $0<a<3$, $0<b\leq0.6$, $0<c<5$, $0<d<5$, and z is nominally 12.

6. The LED component of claim 5, wherein $a+b\leq3$ and $0.1\leq b<0.3$.

7. The LED component of claim 5, wherein $b/(a+b)\cdot100$=mol. % Ce, and $0<$mol. % Ce$<15$.

8. The LED component of claim 7, wherein $3\leq$mol. % Ce$\leq8$.

9. The LED component of claim 5, wherein $d/(c+2d)\cdot100$=mol. % Si=mol. % Mg, and wherein $0<$mol. % Si$<50$ and $0<$mol. % Mg$<50$.

10. The LED component of claim 9, wherein $30<$mol. % Si$<50$ and $30<$mol. % Mg$<50$.

11. The LED component of claim 5, wherein R=(a+b)/(c+2d), and 0.5<R≤0.6.

12. The LED component of claim 11, wherein a+b=3 and c+2d>5.

13. The LED component of claim 5, wherein 0.5≤c≤2.

14. The LED component of claim 13, wherein 1.0≤c≤1.5.

15. The LED component of claim 1, wherein the second phosphor comprises:
a host lattice comprising yttrium aluminum garnet; and
an activator comprising Ce incorporated in the host lattice.

16. The LED component of claim 15, wherein the host lattice of the second phosphor further comprises a substitutional dopant comprising Ga incorporated therein.

17. The LED component of claim 16, wherein the second phosphor comprises a yellow phosphor having a chemical formula $Y_a Ce_b Gd_c Al_d Ga_e O_z$, where 0<a<3, 0<b≤0.6, 0<c≤1, 0<d<5, 0<e≤2.5, and z is nominally 12.

18. The LED component of claim 17, wherein
c/(a+b+c)·100=mol. % Ce, and 3<mol. % Ce<20,
e/(d+e)·100=mol. % Ga, and 5<mol. % Ga<50, and
wherein mol. % Ga≥mol. % Ce.

19. The LED component of claim 18, wherein 3.3≤mol. % Ce<15 and 12≤mol. % Ga<20.

20. The LED component of claim 1, wherein the first phosphor and the second phosphor are mixed together in a phosphor layer on the LED.

21. The LED component of claim 1, wherein the first phosphor and the second phosphor are disposed in separate phosphor layers on the LED, the first phosphor being in a first phosphor layer and the second phosphor being in a second phosphor layer above or below the first phosphor layer.

22. A phosphor with improved excitation properties, the phosphor comprising:
a host lattice comprising yttrium aluminum garnet;
an activator comprising Ce in the host lattice;
a first substitutional dopant comprising Si incorporated in the host lattice; and
a second substitutional dopant comprising Mg incorporated in the host lattice,
wherein the phosphor comprises a peak emission wavelength in the range of from about 600 nm to about 700 nm, and
wherein an excitation spectrum of the phosphor comprises, at excitation wavelengths longer than 530 nm, no intensities greater than about 60% of a maximum intensity of the excitation spectrum.

23. The phosphor of claim 22, wherein the excitation spectrum comprises no intensities greater than about 50% of the maximum intensity of the excitation spectrum at excitation wavelengths longer than 530 nm.

24. The phosphor of claim 22, wherein the peak emission wavelength is in the range of from about 600 nm to about 650 nm.

25. The phosphor of claim 22, wherein the phosphor comprises a chemical formula $Y_a Ce_b Al_c Si_d Mg_d O_z$, where 0<a<3, 0<b≤0.6, 0<c<5, 0<d<5, and z is nominally 12.

* * * * *